United States Patent
Scoggins et al.

(10) Patent No.: US 7,702,594 B2
(45) Date of Patent: Apr. 20, 2010

(54) SYSTEM AND METHOD FOR AUTOMATED CONFIGURATION OF METERS

(75) Inventors: Sean M. Scoggins, Raleigh, NC (US); Russell G. Christopher, Clayton, NC (US); Alexei Garianov, Boulder, CO (US); Dileep Rudran, Cary, NC (US)

(73) Assignee: Elster Electricity, LLC, Raleigh, NC (US)

( * ) Notice: Subject to any disclaimer, the term of this patent is extended or adjusted under 35 U.S.C. 154(b) by 1148 days.

(21) Appl. No.: 10/949,267

(22) Filed: Sep. 24, 2004

(65) Prior Publication Data

US 2006/0069661 A1    Mar. 30, 2006

(51) Int. Cl.
*G01R 11/56* (2006.01)
*G08C 15/06* (2006.01)
*G06F 15/177* (2006.01)
*G06F 1/24* (2006.01)

(52) U.S. Cl. .............. 705/412; 340/870.02; 340/870.03; 340/870.01; 709/220; 713/100

(58) Field of Classification Search ................ 705/412, 705/413, 418; 340/870.02, 870.03, 870.01, 340/870.06, 870.11, 825; 455/405; 379/106.03, 379/102.02, 106.07; 709/220, 217, 228; 713/100; 370/449

See application file for complete search history.

(56) References Cited

U.S. PATENT DOCUMENTS

| 3,445,815 | A | 5/1969 | Saltzberg et al. ............ 340/163 |
| 3,858,212 | A | 12/1974 | Tompkins et al. ..... 343/100 CS |
| 3,878,512 | A | 4/1975 | Kobayashi et al. ...... 340/168 R |
| 3,973,240 | A | 8/1976 | Fong .......................... 340/151 |
| 4,031,513 | A | 6/1977 | Simciak ................... 340/152 T |
| 4,056,107 | A | 11/1977 | Todd et al. .................... 130/27 |
| 4,066,964 | A | 1/1978 | Costanza et al. ............. 325/55 |
| 4,132,981 | A | 1/1979 | White ........................ 340/203 |
| 4,190,800 | A | 2/1980 | Kelly, Jr. et al. .............. 325/37 |

(Continued)

FOREIGN PATENT DOCUMENTS

CH         682196   A5      7/1993

(Continued)

OTHER PUBLICATIONS

Desbonnet, Joe et al., "System Architecture and Implementation of CEBus/Internet Gateway", *IEEE*, 1997, 1057-1062.

(Continued)

*Primary Examiner*—Igor Borissov
(74) *Attorney, Agent, or Firm*—Woodcock Washburn LLP

(57) ABSTRACT

A number of meters to be configured according to a particular billing rate. Multiple billing rates may be defined, named, and stored for use. Each such billing rate may include time of use (TOU) configuration parameters and/or demand configuration parameters. Alternatively, a billing rate may include strictly consumption based parameters. Each billing rate is "meter independent", meaning that it is not specific to any particular meter configuration format. The billing rate is defined in a format that is convenient for the operator and then translated into a format that is specific to each meter on which it is implemented. Thus, to configure a number of different parameters on a number of differently formatted meters, only a single billing rate need be defined and propagated to the meters.

19 Claims, 3 Drawing Sheets

U.S. PATENT DOCUMENTS

| | | | |
|---|---|---|---|
| 4,204,195 A | 5/1980 | Bogacki | 340/151 |
| 4,218,737 A | 8/1980 | Buscher et al. | 364/493 |
| 4,250,489 A | 2/1981 | Dudash et al. | 340/147 |
| 4,254,472 A | 3/1981 | Juengel et al. | 364/900 |
| 4,319,358 A | 3/1982 | Sepp | 375/1 |
| 4,321,582 A | 3/1982 | Banghart | 340/310 |
| 4,322,842 A | 3/1982 | Martinez | 370/204 |
| 4,328,581 A | 5/1982 | Harmon et al. | 371/8 |
| 4,361,851 A | 11/1982 | Asip et al. | 358/84 |
| 4,361,890 A | 11/1982 | Green, Jr. et al. | 375/1 |
| 4,396,915 A | 8/1983 | Farnsworth et al. | 340/870.03 |
| 4,405,829 A | 9/1983 | Rivest et al. | 178/22.14 |
| 4,415,896 A | 11/1983 | Allgood | 340/310 |
| 4,466,001 A | 8/1984 | Moore et al. | 340/825.08 |
| 4,504,831 A | 3/1985 | Jahr et al. | 340/870.03 |
| 4,506,386 A | 3/1985 | Ichikawa et al. | 455/343 |
| 4,513,415 A | 4/1985 | Martinez | 370/92 |
| 4,525,861 A | 6/1985 | Freeburg | 455/33 |
| 4,600,923 A | 7/1986 | Hicks et al. | 340/870.02 |
| 4,608,699 A | 8/1986 | Batlivala et al. | 375/216 |
| 4,611,333 A | 9/1986 | McCallister et al. | 375/1 |
| 4,614,945 A | 9/1986 | Brunius et al. | 340/870.03 |
| 4,617,566 A | 10/1986 | Diamond | 340/870.11 |
| 4,628,313 A | 12/1986 | Gombrich et al. | 340/870.02 |
| 4,631,538 A | 12/1986 | Carreno | 340/870.18 |
| 4,638,298 A | 1/1987 | Spiro | 340/827 |
| 4,644,321 A | 2/1987 | Kennon | 340/310 |
| 4,653,076 A | 3/1987 | Jerrim et al. | 375/115 |
| 4,672,555 A | 6/1987 | Hart et al. | 700/276 |
| 4,680,704 A | 7/1987 | Konicek et al. | 364/525 |
| 4,688,038 A | 8/1987 | Giammarese | 340/870.02 |
| 4,692,761 A | 9/1987 | Robinton | 340/825 |
| 4,707,852 A | 11/1987 | Jahr et al. | 379/107 |
| 4,713,837 A | 12/1987 | Gordon | 379/93 |
| 4,724,435 A | 2/1988 | Moses et al. | 340/870.13 |
| 4,728,950 A | 3/1988 | Hendrickson et al. | 340/870.31 |
| 4,734,680 A | 3/1988 | Gehman et al. | 340/539 |
| 4,749,992 A | 6/1988 | Fitzemeyer et al. | 340/870.02 |
| 4,757,456 A | 7/1988 | Benghiat | 364/464 |
| 4,769,772 A | 9/1988 | Dwyer | 364/300 |
| 4,783,748 A | 11/1988 | Swarztrauber et al. | 364/483 |
| 4,792,946 A | 12/1988 | Mayo | 370/338 |
| 4,799,059 A | 1/1989 | Grindahl et al. | 340/870.03 |
| 4,804,938 A | 2/1989 | Rouse et al. | 340/310 |
| 4,804,957 A | 2/1989 | Selph et al. | 340/870.03 |
| 4,811,011 A | 3/1989 | Sollinger | 340/870.02 |
| 4,827,514 A | 5/1989 | Ziolko et al. | 380/48 |
| 4,833,618 A | 5/1989 | Verma et al. | 364/483 |
| 4,839,645 A | 6/1989 | Lill | 340/870.17 |
| 4,841,545 A | 6/1989 | Endo et al. | 375/1 |
| 4,860,379 A | 8/1989 | Schoeneberger et al. | 455/5 |
| 4,862,493 A | 8/1989 | Venkataraman et al. | 379/107 |
| 4,868,877 A | 9/1989 | Fischer | 380/25 |
| 4,884,021 A | 11/1989 | Hammond et al. | 324/142 |
| 4,912,722 A | 3/1990 | Carlin | 375/1 |
| 4,922,518 A | 5/1990 | Gordon et al. | 379/57 |
| 4,939,726 A | 7/1990 | Flammer et al. | 370/94.1 |
| 4,940,974 A | 7/1990 | Sojka | 340/825.08 |
| 4,940,976 A | 7/1990 | Gastouniotis et al. | 340/870.02 |
| 4,958,359 A | 9/1990 | Kato | 375/1 |
| 4,964,138 A | 10/1990 | Nease et al. | 375/1 |
| 4,965,533 A | 10/1990 | Gilmore | 331/18 |
| 4,972,507 A | 11/1990 | Lusignan | 455/51 |
| 5,007,052 A | 4/1991 | Flammer | 370/85.6 |
| 5,018,165 A | 5/1991 | Sohner et al. | 375/1 |
| 5,022,046 A | 6/1991 | Morrow, Jr. | 375/1 |
| 5,032,833 A | 7/1991 | Laporte | 340/825.02 |
| 5,053,766 A | 10/1991 | Ruiz-del-Portal et al. | 340/870.02 |
| 5,053,774 A | 10/1991 | Schuermann et al. | 342/44 |
| 5,056,107 A | 10/1991 | Johnson et al. | 375/1 |
| 5,067,136 A | 11/1991 | Arthur et al. | 375/1 |
| 5,079,715 A | 1/1992 | Venkataraman et al. | 364/481 |
| 5,079,768 A | 1/1992 | Flammer | 370/94.1 |
| 5,086,292 A | 2/1992 | Johnson et al. | 340/637 |
| 5,086,385 A | 2/1992 | Launey | 364/188 |
| 5,090,024 A | 2/1992 | Vander Mey et al. | 375/1 |
| 5,111,479 A | 5/1992 | Akazawa | 375/1 |
| 5,115,433 A | 5/1992 | Baran et al. | 370/94.3 |
| 5,115,448 A | 5/1992 | Mori | 375/1 |
| 5,129,096 A | 7/1992 | Burns | 455/18 |
| 5,130,987 A | 7/1992 | Flammer | 370/103 |
| 5,132,985 A | 7/1992 | Hashimoto et al. | 375/1 |
| 5,136,614 A | 8/1992 | Hiramatsu et al. | 375/1 |
| 5,142,694 A | 8/1992 | Jackson et al. | 455/67.1 |
| 5,151,866 A | 9/1992 | Glaser et al. | 364/483 |
| 5,155,481 A | 10/1992 | Brennan, Jr. et al. | 340/870.02 |
| 5,160,926 A | 11/1992 | Schweitzer, III | 340/870.02 |
| 5,166,664 A | 11/1992 | Fish | 340/539 |
| 5,177,767 A | 1/1993 | Kato | 375/1 |
| 5,179,376 A | 1/1993 | Pomatto | 340/870.02 |
| 5,189,694 A | 2/1993 | Garland | 379/106 |
| 5,194,860 A | 3/1993 | Jones et al. | 340/370.02 |
| 5,197,095 A | 3/1993 | Bonnet | 379/107 |
| 5,204,877 A | 4/1993 | Endo et al. | 375/1 |
| 5,214,587 A | 5/1993 | Green | 364/464.04 |
| 5,225,994 A | 7/1993 | Arinobu et al. | 364/492 |
| 5,228,029 A | 7/1993 | Kotzin | 370/95.1 |
| 5,229,996 A | 7/1993 | Bäckström et al. | 370/100.1 |
| 5,239,575 A | 8/1993 | White et al. | 379/107 |
| 5,239,584 A | 8/1993 | Hershey et al. | 380/28 |
| 5,243,338 A | 9/1993 | Brennan, Jr. et al. | 340/870.02 |
| 5,252,967 A | 10/1993 | Brennan et al. | 340/870.02 |
| 5,260,943 A | 11/1993 | Comroe et al. | 370/95.1 |
| 5,270,704 A | 12/1993 | Sosa Quintana et al. | 340/870.02 |
| 5,280,498 A | 1/1994 | Tymes et al. | 375/1 |
| 5,280,499 A | 1/1994 | Suzuki | 375/1 |
| 5,285,469 A | 2/1994 | Vanderpool | 375/1 |
| 5,287,287 A | 2/1994 | Chamberlain et al. | 364/483 |
| 5,289,497 A | 2/1994 | Jacobson et al. | 375/1 |
| 5,295,154 A | 3/1994 | Meier et al. | 375/1 |
| 5,307,349 A | 4/1994 | Shloss et al. | 370/85.2 |
| 5,311,541 A | 5/1994 | Sanderford, Jr. | 375/1 |
| 5,311,542 A | 5/1994 | Eder | 375/1 |
| 5,315,531 A | 5/1994 | Oravetz et al. | 364/550 |
| 5,319,679 A | 6/1994 | Bagby | 375/106 |
| 5,329,547 A | 7/1994 | Ling | 375/1 |
| 5,345,225 A | 9/1994 | Davis | 340/635 |
| 5,359,625 A | 10/1994 | Vander Mey et al. | 375/1 |
| 5,377,222 A | 12/1994 | Sanderford, Jr. | 375/1 |
| 5,381,462 A | 1/1995 | Larson et al. | 379/107 |
| 5,383,134 A | 1/1995 | Wrzesinski | 364/514 |
| 5,384,712 A | 1/1995 | Oravetz et al. | 364/550 |
| 5,387,873 A | 2/1995 | Muller et al. | 327/155 |
| 5,390,360 A | 2/1995 | Scop et al. | 455/34.2 |
| 5,406,495 A | 4/1995 | Hill | 364/483 |
| 5,416,917 A | 5/1995 | Adair et al. | 395/500 |
| 5,420,799 A | 5/1995 | Peterson et al. | 364/483 |
| 5,428,636 A | 6/1995 | Meier | 375/202 |
| 5,430,759 A | 7/1995 | Yokev et al. | 375/202 |
| 5,432,507 A | 7/1995 | Mussino et al. | 340/870.03 |
| 5,432,815 A | 7/1995 | Kang et al. | 375/200 |
| 5,438,329 A | 8/1995 | Gastouniotis et al. | 340/870.02 |
| 5,448,230 A | 9/1995 | Schanker et al. | 340/870.03 |
| 5,448,570 A | 9/1995 | Toda et al. | 370/95.3 |
| 5,450,088 A | 9/1995 | Meier et al. | 342/51 |
| 5,452,465 A | 9/1995 | Geller et al. | 395/800 |
| 5,455,533 A | 10/1995 | Köllner | 327/484 |
| 5,455,544 A | 10/1995 | Kechkaylo | 332/103 |
| 5,455,569 A | 10/1995 | Sherman et al. | 340/825.02 |
| 5,455,822 A | 10/1995 | Dixon et al. | 370/18 |
| 5,457,713 A | 10/1995 | Sanderford, Jr. et al. | 375/206 |
| 5,461,558 A | 10/1995 | Patsiokas et al. | 364/145 |

| Patent No. | Date | Inventor | Class |
|---|---|---|---|
| 5,463,657 A | 10/1995 | Rice | 375/200 |
| 5,473,322 A | 12/1995 | Carney | 340/870.02 |
| 5,475,742 A | 12/1995 | Gilbert | 379/106 |
| 5,475,867 A | 12/1995 | Blum | 455/53.1 |
| 5,479,442 A | 12/1995 | Yamamoto | 375/206 |
| 5,481,259 A | 1/1996 | Bane | 340/870.03 |
| 5,488,608 A | 1/1996 | Flammer, III | 370/85.13 |
| 5,491,473 A | 2/1996 | Gilbert | 340/870.01 |
| 5,493,287 A | 2/1996 | Bane | 340/825.52 |
| 5,495,239 A | 2/1996 | Ouellette | 340/870.02 |
| 5,497,424 A | 3/1996 | Vanderpool | 380/34 |
| 5,499,243 A | 3/1996 | Hall | 370/85.8 |
| 5,500,871 A | 3/1996 | Kato et al. | 375/208 |
| 5,511,188 A | 4/1996 | Pascucci et al. | 395/600 |
| 5,519,388 A | 5/1996 | Adair, Jr. | 340/870.02 |
| 5,521,910 A | 5/1996 | Matthews | 370/54 |
| 5,522,044 A | 5/1996 | Pascucci et al. | 395/200.06 |
| 5,524,280 A | 6/1996 | Douthitt et al. | 455/62 |
| 5,525,898 A | 6/1996 | Lee, Jr. et al. | 324/142 |
| 5,526,389 A | 6/1996 | Buell et al. | 375/200 |
| 5,528,507 A | 6/1996 | McNamara et al. | 364/483 |
| 5,528,597 A | 6/1996 | Gerszberg et al. | 370/95.3 |
| 5,539,775 A | 7/1996 | Tuttle et al. | 375/200 |
| 5,541,589 A | 7/1996 | Delaney | 340/870.02 |
| 5,544,036 A | 8/1996 | Brown, Jr. et al. | 364/145 |
| 5,546,424 A | 8/1996 | Miyake | 375/206 |
| 5,548,527 A | 8/1996 | Hemminger et al. | 364/492 |
| 5,548,633 A | 8/1996 | Kujawa et al. | 379/93 |
| 5,553,094 A | 9/1996 | Johnson et al. | 375/200 |
| 5,555,508 A | 9/1996 | Munday et al. | 364/492 |
| 5,559,870 A | 9/1996 | Patton et al. | 379/107 |
| 5,566,332 A | 10/1996 | Adair et al. | 395/600 |
| 5,570,084 A | 10/1996 | Ritter et al. | 340/825.05 |
| 5,572,438 A | 11/1996 | Ehlers et al. | 364/492 |
| 5,574,657 A | 11/1996 | Tofte | 364/510 |
| 5,590,179 A | 12/1996 | Shincovich et al. | 379/107 |
| 5,592,470 A | 1/1997 | Rudrapatna et al. | 370/320 |
| 5,594,740 A | 1/1997 | LaDue | 379/59 |
| 5,602,744 A | 2/1997 | Meek et al. | 364/464.22 |
| 5,617,084 A | 4/1997 | Sears | 331/176 |
| 5,619,192 A | 4/1997 | Ayala | 340/870.02 |
| 5,619,685 A | 4/1997 | Schiavone | 395/500 |
| 5,621,629 A | 4/1997 | Hemminger et al. | 363/56 |
| 5,627,759 A | 5/1997 | Bearden et al. | 364/483 |
| 5,631,636 A | 5/1997 | Bane | 340/825.69 |
| 5,636,216 A | 6/1997 | Fox et al. | 370/402 |
| 5,640,679 A | 6/1997 | Lundqvist et al. | 455/33.2 |
| 5,659,300 A | 8/1997 | Dresselhuys et al. | 340/870.02 |
| 5,668,803 A | 9/1997 | Tymes et al. | 370/312 |
| 5,668,828 A | 9/1997 | Sanderford, Jr. et al. | 375/202 |
| 5,673,252 A * | 9/1997 | Johnson et al. | 370/449 |
| 5,684,472 A | 11/1997 | Bane | 340/870.02 |
| 5,684,799 A | 11/1997 | Bigham et al. | 370/397 |
| 5,691,715 A | 11/1997 | Ouellette | 340/870.09 |
| 5,692,180 A | 11/1997 | Lee | 395/610 |
| 5,696,501 A * | 12/1997 | Ouellette et al. | 340/870.02 |
| 5,696,765 A | 12/1997 | Safadi | 370/436 |
| 5,696,903 A | 12/1997 | Mahany | 395/200.58 |
| 5,699,276 A | 12/1997 | Roos | 364/514 A |
| 5,714,931 A | 2/1998 | Petite et al. | 340/539 |
| 5,715,390 A | 2/1998 | Hoffman et al. | 395/188.01 |
| 5,717,604 A | 2/1998 | Wiggins | 364/514 C |
| 5,719,564 A | 2/1998 | Sears | 340/870.02 |
| 5,732,078 A | 3/1998 | Arango | 370/355 |
| 5,745,901 A | 4/1998 | Entner et al. | 707/103 |
| 5,748,104 A | 5/1998 | Argyroudis et al. | 340/870.11 |
| 5,748,619 A | 5/1998 | Meier | 370/278 |
| 5,751,914 A | 5/1998 | Coley et al. | 395/51 |
| 5,751,961 A | 5/1998 | Smyk | 395/200.47 |
| 5,754,772 A | 5/1998 | Leaf | 395/200.33 |
| 5,754,830 A | 5/1998 | Butts et al. | 395/500 |
| 5,757,783 A | 5/1998 | Eng et al. | 370/315 |
| 5,768,148 A | 6/1998 | Murphy et al. | 364/492 |
| 5,778,368 A | 7/1998 | Hogan et al. | 707/10 |
| 5,787,437 A | 7/1998 | Potterveld et al. | 707/103 |
| 5,790,789 A | 8/1998 | Suarez | 395/200.32 |
| 5,790,809 A | 8/1998 | Holmes | 395/200.58 |
| 5,801,643 A | 9/1998 | Williams et al. | 340/870.02 |
| 5,805,712 A | 9/1998 | Davis | 380/50 |
| 5,808,558 A | 9/1998 | Meek et al. | 340/870.01 |
| 5,809,059 A | 9/1998 | Souissi et al. | 375/202 |
| 5,822,521 A | 10/1998 | Gartner et al. | 395/200.6 |
| 5,850,187 A | 12/1998 | Carrender et al. | 340/10.42 |
| 5,862,391 A | 1/1999 | Salas et al. | 395/750.01 |
| 5,872,774 A | 2/1999 | Wheatley, III et al. | 370/335 |
| 5,874,903 A | 2/1999 | Shuey et al. | 340/870.02 |
| 5,875,183 A | 2/1999 | Nitadori | 370/328 |
| 5,875,402 A | 2/1999 | Yamawaki | 455/502 |
| 5,884,184 A | 3/1999 | Sheffer | 455/521 |
| 5,892,758 A | 4/1999 | Argyroudis | 370/335 |
| 5,896,382 A | 4/1999 | Davis et al. | 370/401 |
| 5,897,607 A | 4/1999 | Jenney et al. | 702/62 |
| 5,898,387 A | 4/1999 | Davis et al. | 340/870.02 |
| 5,907,491 A | 5/1999 | Canada et al. | 364/468.15 |
| 5,907,540 A | 5/1999 | Hayashi | 370/315 |
| 5,910,799 A | 6/1999 | Carpenter et al. | 345/333 |
| 5,923,269 A | 7/1999 | Shuey et al. | 340/870.02 |
| 5,926,103 A | 7/1999 | Petite | 340/825.19 |
| 5,926,531 A | 7/1999 | Petite | 379/144 |
| 5,943,375 A | 8/1999 | Veintimilla | 375/355 |
| 5,944,842 A | 8/1999 | Propp et al. | 714/701 |
| 5,953,319 A | 9/1999 | Dutta et al. | 370/238 |
| 5,958,018 A | 9/1999 | Eng et al. | |
| 5,959,550 A | 9/1999 | Giles | 340/870.02 |
| 5,960,074 A | 9/1999 | Clark | 379/310 |
| 5,963,146 A | 10/1999 | Johnson et al. | 340/870.1 |
| 5,974,236 A | 10/1999 | Sherman | 395/200.51 |
| 5,986,574 A | 11/1999 | Colton | 340/870.02 |
| 6,000,034 A | 12/1999 | Lightbody et al. | 713/202 |
| 6,028,522 A | 2/2000 | Petite | 340/641 |
| 6,034,988 A | 3/2000 | VanderMey et al. | 375/202 |
| 6,035,201 A | 3/2000 | Whitehead | 455/455 |
| 6,041,056 A | 3/2000 | Bigham et al. | 370/395 |
| 6,061,604 A | 5/2000 | Russ et al. | 700/90 |
| 6,067,029 A | 5/2000 | Durston | 340/870.03 |
| 6,073,169 A | 6/2000 | Shuey et al. | 709/217 |
| 6,073,174 A | 6/2000 | Montgomerie et al. | 709/224 |
| 6,078,251 A | 6/2000 | Landt et al. | 340/10.41 |
| 6,078,785 A | 6/2000 | Bush | 455/7 |
| 6,078,909 A | 6/2000 | Knutson | 705/59 |
| 6,088,659 A * | 7/2000 | Kelley et al. | 702/62 |
| 6,091,758 A | 7/2000 | Ciccone et al. | 375/132 |
| 6,100,817 A | 8/2000 | Mason, Jr. et al. | 340/870.02 |
| 6,112,192 A | 8/2000 | Capek | 705/59 |
| 6,124,806 A * | 9/2000 | Cunningham et al. | 340/870.02 |
| 6,128,276 A | 10/2000 | Agee | 370/288 |
| 6,137,423 A | 10/2000 | Glorioso et al. | 340/870.02 |
| 6,150,955 A | 11/2000 | Tracy et al. | 340/870.02 |
| 6,154,487 A | 11/2000 | Murai et al. | 375/150 |
| 6,160,993 A | 12/2000 | Wilson | 455/12.1 |
| 6,172,616 B1 * | 1/2001 | Johnson et al. | 340/870.12 |
| 6,195,018 B1 | 2/2001 | Ragle et al. | 340/870.01 |
| 6,199,068 B1 * | 3/2001 | Carpenter | 707/100 |
| 6,208,266 B1 | 3/2001 | Lyons et al. | 340/870.02 |
| 6,218,953 B1 | 4/2001 | Petite | 340/641 |
| 6,233,327 B1 | 5/2001 | Petite | 379/155 |
| 6,246,677 B1 | 6/2001 | Nap et al. | 370/346 |
| 6,249,516 B1 | 6/2001 | Brownrigg et al. | 370/338 |
| 6,333,975 B1 | 12/2001 | Brunn et al. | 379/106.03 |
| 6,363,057 B1 | 3/2002 | Ardalan et al. | 370/252 |
| 6,393,341 B1 | 5/2002 | Lawrence et al. | 700/286 |
| 6,396,839 B1 | 5/2002 | Ardalan et al. | 370/401 |
| 6,421,731 B1 | 7/2002 | Ciotti, Jr. et al. | 709/238 |
| 6,430,268 B1 | 8/2002 | Petite | 379/39 |
| 6,437,692 B1 | 8/2002 | Petite et al. | 340/540 |
| 6,446,192 B1 | 9/2002 | Narasimhan et al. | 712/29 |

| | | | | |
|---|---|---|---|---|
| 6,643,278 | B1 | 11/2003 | Panasik et al. | 370/330 |
| 6,657,549 | B1 | 12/2003 | Avery | 340/825.49 |
| 6,684,245 | B1 | 1/2004 | Shuey et al. | 709/223 |
| 6,751,563 | B2 | 6/2004 | Spanier et al. | 702/61 |
| 6,867,707 | B1 | 3/2005 | Kelley et al. | 340/870.02 |
| 7,230,544 | B2 * | 6/2007 | Van Heteren | 340/870.03 |
| 2001/0002210 | A1 | 5/2001 | Petite | 379/155 |
| 2001/0024163 | A1 | 9/2001 | Petite | 340/628 |
| 2002/0012323 | A1 | 1/2002 | Petite et al. | 370/252 |
| 2002/0013679 | A1 | 1/2002 | Petite | 702/188 |
| 2002/0019712 | A1 | 2/2002 | Petite et al. | 702/61 |
| 2002/0019725 | A1 | 2/2002 | Petite | 702/188 |
| 2002/0026957 | A1 | 3/2002 | Reyman | 137/39 |
| 2002/0027504 | A1 | 3/2002 | Davis et al. | 340/540 |
| 2002/0031101 | A1 | 3/2002 | Petite et al. | 370/310 |
| 2002/0094799 | A1 | 7/2002 | Elliott et al. | 455/405 |
| 2002/0125998 | A1 | 9/2002 | Petite et al. | 340/286.01 |
| 2002/0145537 | A1 | 10/2002 | Mueller et al. | 340/870.02 |
| 2002/0169643 | A1 | 11/2002 | Petite et al. | 705/5 |
| 2003/0036810 | A1 | 2/2003 | Petite | 700/9 |
| 2003/0036822 | A1 | 2/2003 | Davis et al. | 700/295 |
| 2003/0123442 | A1 | 7/2003 | Drucker et al. | 370/392 |
| 2003/0184448 | A1 * | 10/2003 | Kagan | 340/870.28 |
| 2003/0202512 | A1 | 10/2003 | Kennedy | 370/389 |
| 2004/0113810 | A1 | 6/2004 | Mason, Jr. et al. | 340/870.02 |
| 2005/0017874 | A1 * | 1/2005 | Lightbody et al. | 340/870.02 |
| 2005/0184881 | A1 | 8/2005 | Dusenberry et al. | 340/870.02 |
| 2005/0270173 | A1 | 12/2005 | Boaz | 340/870.02 |

FOREIGN PATENT DOCUMENTS

| | | |
|---|---|---|
| EP | 0 395 495 A1 | 10/1990 |
| EP | 0 446 979 A1 | 9/1991 |
| EP | 0 629 098 A2 | 12/1994 |
| GB | 2 118 340 A | 10/1983 |
| GB | 2 157 448 A | 10/1985 |
| GB | 2 186 404 A | 8/1987 |
| GB | 02 222 898 A | 3/1990 |
| GB | 2 237 910 A | 5/1991 |
| JP | 59-229949 A2 | 12/1984 |
| JP | 02-067967 | 3/1990 |
| JP | 4290593 A | 10/1992 |
| JP | 05-260569 | 10/1993 |
| JP | 8194023 A | 7/1996 |
| NZ | 507777 | 9/2003 |
| WO | 93/02515 A1 | 2/1993 |
| WO | 93/04451 A1 | 3/1993 |
| WO | 95/32595 A1 | 11/1995 |
| WO | 96/10856 A1 | 4/1996 |
| WO | WO9958987 | 11/1999 |
| WO | WO 2004/004364 A2 | 1/2004 |

OTHER PUBLICATIONS

Markwalter, Brian et al., "CEBus Network Layer Description", *IEEE*, 1989, 571-575.

Newtown, Harry, *Newton's Telecom Dictionary*, Flatiron Publishing, Inc., *10th Ed.*, 1996, LAN (1 of 1): Cebus Overview (1-3): Cebus Industry Council (1 of 1).

Newtown, Harry, *Newton's Telecom Dictionary*, 10th Edition, 1996, 243.

International Search Report issued in International Application No. PCT/US98/11170 Date of Mailing: Oct. 7, 1998.

International Search Report issued in International Application No. PCT/US98/19034 Date of Mailing: Feb. 1, 1999.

Internet Printout, http://www.ram.com BellSouth Wireless Data—Paging, Mobitex, Network, Business, Sep. 23, 1998:—Mobitex®: The Heart of Every BellSouth Solution—Mobitex Features and Services: RAM Mobile Data White Paper, Feb. 1997—Narrowband PCS Technologies: What are the Options?: RAM Mobile Data White Paper, Nov. 1997—The Inherent Security of Data Over Mobitex Wireless Packet Data Networks, A RAM Mobile Data White Paper, Oct. 1995—Comparative Analysis of Coverage and Performance: RAM & Ardis, 1998.

Internet Printout, http://www.ardis.com "Ardis Two-Way, Wireless Data Communications," ARDIS, Sep. 23, 1998.

Internet Printout, http://ww.ardis.com/RADIO "An Overview of Radio Coverage," Sep. 29, 1998 "Radio Propagation," Sep. 29, 1998 "Factors Affecting ARDIS Coverage," Sep. 29, 1998 "The ARDIS Network Compared to Other Systems," Sep. 29, 1998.

Internet Printout, http://www.ardis.com/RADIO "Radio Coverage," Sep. 29, 1998 "Glossary of Terms," Sep. 29, 1998 "Radio Propagation in Free Space," Sep. 29, 1998 "Real World Propagation Variations," Sep. 29, 1998 "Probability of Reception vs. Calculation," Sep. 29, 1998.

Rappaport, T. S., "Wireless Communications, Principles and Practice," Prentice Hall PTR, 1996, pp. 410-413.

Brochure: TRF6900 Single-Chip RF Transceiver, Texas Instrument, 2001©.

Corcoran, P.M. et al., "CEBus Network Access via the World-Wide-Web", *International Conference on Consumer Electronics*, Jun. 5-7, 1996, 236-237, XP-002218722.

Corcoran, P.M. et al., "Browser-Style Interfaces to a Home Automation Network", *IEEE Trans. On Consumer Electronics*, Nov. 1, 1997, 43(4), 1063-1069, XP-000768559.

Norenkov, et al., *Telecommunication Technologies and Networks, Moscow Bauman Technical School*, 1988, (Signed for publication on Dec. 10, 1997), pp. 116-118, 80-87 [1] English Language Abstract Provided.

Brownrigg, E. Ph.D., "Developing the Information Superhighway Issues for Libraries", *Library Perspectives on NREN*, The National Research and Education Network, 1990, 55-63.

Brownrigg, E.B., "The Internet as an External Economy: The Emergence of the Invisible Hand", *Library Administration and Management*, 1991, 95-97.

Frankel, M.S., "Packet Radios Provide Link for Distributed, Survivable C3 in Post-Attack Scenarios", *MSN*, Jun. 1983, 80-108.

Gower, N. et al., "Congestion Control Using Pacing in a Packet Radio Network", *IEEE Military Communications Conference*, 1982, 1, 23.1-1, 23-1-6.

Johnson, D.B., "Routing in Ad Hoc Networks of Mobile Hosts", *IEEE*, 1995, 158-163.

Jubin, J., "Current Packet Radio Networks Protocols", *IEEE Infocom Proceedings*, 1985, 86-92.

Jubin, J. et al., "The DARPA Packet Radio Network Protocols", *Proceedings of the IEEE*, 1987, 75(1), 21-32.

Kahn, R.E., "The Organization of Computer Resources into a Packet Radio Network", *IEEE Transactions on Communications*, 1977, 25(1), 169-178.

Kahn, R.E., et al., "Advances in Packet Radio Technology", *proceedings of the IEEE*, 1978, 66(11), 1468-1496.

Lauer, G. et al., "Survivable Protocols for Large Scale Packet Radio Networks", *IEEE Global Telecommunications Conference*, 1984, 468-471.

Lynch, C.A. et al., "Electronic Publishing, Electronic Imaging, and Document Delivery", *Electronic Imaging, International Electronic Imaging Exposition & Conference*, 1986, 662-667.

Lynch, C.A. et al., "The Telecommunications Landscape", 1986, 7 pages.

Lynch, C.A. et al., "Routing, Repeating, Power Control and Directional Techniques", *Packet Radio Networks*, Architectures, Protocols, Technologies and Applications, 1987, Ch 5, 105-129, 259-274.

MacGregor, W. et al., "Multiple Control Stations in Packet Radio Networks", *IEEE Military Communications Conference*, 1982, 10.3-1-10.3-5.

Shachan, N. et al., "A Packet Radio Network for Library Automation", *IEEE Military Communications Conference*, 1987, 2, 21.3.1-21.3.7.

Shacham, N. et al., "Future Directions in Packet Radio Technology", *IEEE Infocom Proceedings*, 1985, 93-98.

Westcott, J.A., "Issues in Distributed Routing for Mobile Packet Radio Networks", *IEEE*, 1982, 233-238.

Wescott, J. et al., "A Distributed Routing Design for a Broadcast Environment", *IEEE Military Communications Conference*, 1982, 10.4-1-10.4-5.

"Packet Radio: Applications for Libraries in Developing Countries", *UDT Series on Data Communication Technologies and Standards for Libraries*, 1993, Ch 1-6, 87 pages.

Chlamtac, I. et al., "Optimizing the System of Virtual Paths", *IEEE ACM Transactions on Networking*, 1994, 2(6), 581-586.

Leung, V.C.M., "Internetworking Wireless Terminals to Local Area Networks Via Radio Bridges", *ICWC*, 1992, 126-129.

Pollini, G.P. et al., "Path Optimization Procedures for Efficient Routing of Information after an Inter-Switch Handover", *IEEE*, 1994, 1-5.

Rajagopalan, B. et al., "A New Responsive Distributed Shortest-Path Routing Algorithm", *ACM*, 1989, 237-246.

Examination Report for New Zealand application No. 554164, dated Apr. 15, 2009.

* cited by examiner

SYSTEM AND METHOD FOR AUTOMATED CONFIGURATION OF METERS

FIELD OF THE INVENTION

The present invention relates to wireless networks for collecting data, and more particularly, to systems and methods for automated configuration of meters.

BACKGROUND OF THE INVENTION

The collection of meter data from electrical energy, water, and gas meters has traditionally been performed by human meter-readers. The meter-reader travels to the meter location, which is frequently on the customer's premises, visually inspects the meter, and records the reading. The meter-reader may be prevented from gaining access to the meter as a result of inclement weather or, where the meter is located within the customer's premises, due to an absentee customer. This methodology of meter data collection is labor intensive, prone to human error, and often results in stale and inflexible metering data.

Some meters have been enhanced to include a one-way radio transmitter for transmitting metering data to a receiving device. A person collecting meter data that is equipped with an appropriate radio receiver need only come into proximity with a meter to read the meter data and need not visually inspect the meter. Thus, a meter-reader may walk or drive by a meter location to take a meter reading. While this represents an improvement over visiting and visually inspecting each meter, it still requires human involvement in the process.

An automated means for collecting meter data involves a fixed wireless network. Devices such as, for example, repeaters and gateways are permanently affixed on rooftops and pole-tops and strategically positioned to receive data from enhanced meters fitted with radio-transmitters. Typically, these transmitters operate in the 902-928 MHz range and employ Frequency Hopping Spread Spectrum (FHSS) technology to spread the transmitted energy over a large portion of the available bandwidth.

Data is transmitted from the meters to the repeaters and gateways and ultimately communicated to a central location. While fixed wireless networks greatly reduce human involvement in the process of meter reading, such systems require the installation and maintenance of a fixed network of repeaters, gateways, and servers. Identifying an acceptable location for a repeater or server and physically placing the device in the desired location on top of a building or utility pole is a tedious and labor-intensive operation. When a portion of the network fails to operate as intended, human intervention is typically required to test the effected components and reconfigure the network to return it to operation.

Another drawback of a conventional fixed wireless networks is that each meter within the network needs to be manually configured one at a time to communicate with a particular portion of the established network. This process is particularly cumbersome because many of the meter parameters must be configured independently of one another. For example, meter parameters such as time of use (TOU) switch times and demand configuration must be independently configured. Furthermore, each meter's display must be independently programmed to display items relevant to the meter's individual configuration.

Thus, while existing fixed wireless networks have reduced the need for human involvement in the daily collection of meter data, such networks require substantial human investment in planning, installation, configuration, and maintenance and are relatively inflexible and difficult to manage. Therefore, there is a need for a systems and methods for automated configuration of meters.

SUMMARY OF THE INVENTION

The present invention is directed to systems and methods for automated configuration of meters. The present invention enables a number of meters to be configured according to a particular billing rate. The present invention also enables multiple billing rates may be defined, named, and stored for use. Each such billing rate may include time of use (TOU) configuration parameters and/or demand configuration parameters. Alternatively, a billing rate may also include strictly consumption based parameters. Each billing rate is "meter independent", meaning that it is not specific to any particular meter configuration format. The billing rate is defined in a format that is convenient for the operator and then translated into a format that is specific to each meter on which it is implemented. Thus, to configure a number of different parameters on a number of differently formatted meters, only a single billing rate need be defined and propagated to the meters.

According to an aspect of the invention, a billing rate may be assigned to one or more meters either manually or programmatically. Upon assigning a billing rate to the meters, the configuration parameters corresponding to the billing rate are retrieved and analyzed to determine whether the meters are capable of implementing the parameters. If any of the meters are unable to implement the parameters or if the system cannot configure any of the meters, then the assigned billing rate may be refused for those meters.

According to another aspect of the invention, each meter may be configured to display information relevant to its assigned billing rate in its meter display area. Each meter may be configured to display such relevant information even if the assigned billing rate differs from the meter's underlying configuration.

Additional features and advantages of the invention will be made apparent from the following detailed description of illustrative embodiments that proceeds with reference to the accompanying drawings.

BRIEF DESCRIPTION OF THE DRAWINGS

The foregoing summary, as well as the following detailed description of preferred embodiments, is better understood when read in conjunction with the appended drawings. For the purpose of illustrating the invention, there is shown in the drawings exemplary constructions of the invention; however, the invention is not limited to the specific methods and instrumentalities disclosed. In the drawings.

DETAILED DESCRIPTION OF ILLUSTRATIVE EMBODIMENTS

Exemplary systems and methods for gathering meter data are described below with reference to FIGS. 1-3. It will be appreciated by those of ordinary skill in the art that the description given herein with respect to those figures is for exemplary purposes only and is not intended in any way to limit the scope of potential embodiments.

Generally, a plurality of meter devices, which operate to track usage of a service or commodity such as, for example, electricity, water, and gas, are operable to wirelessly communicate with each other. A collector is operable to automatically identify and register meters for communication with the collector. When a meter is installed, the meter becomes registered with the collector that can provide a communication path to the meter. The collectors receive and compile metering data from a plurality of meter devices via wireless communications. A communications server communicates with the collectors to retrieve the compiled meter data.

Figure 1:
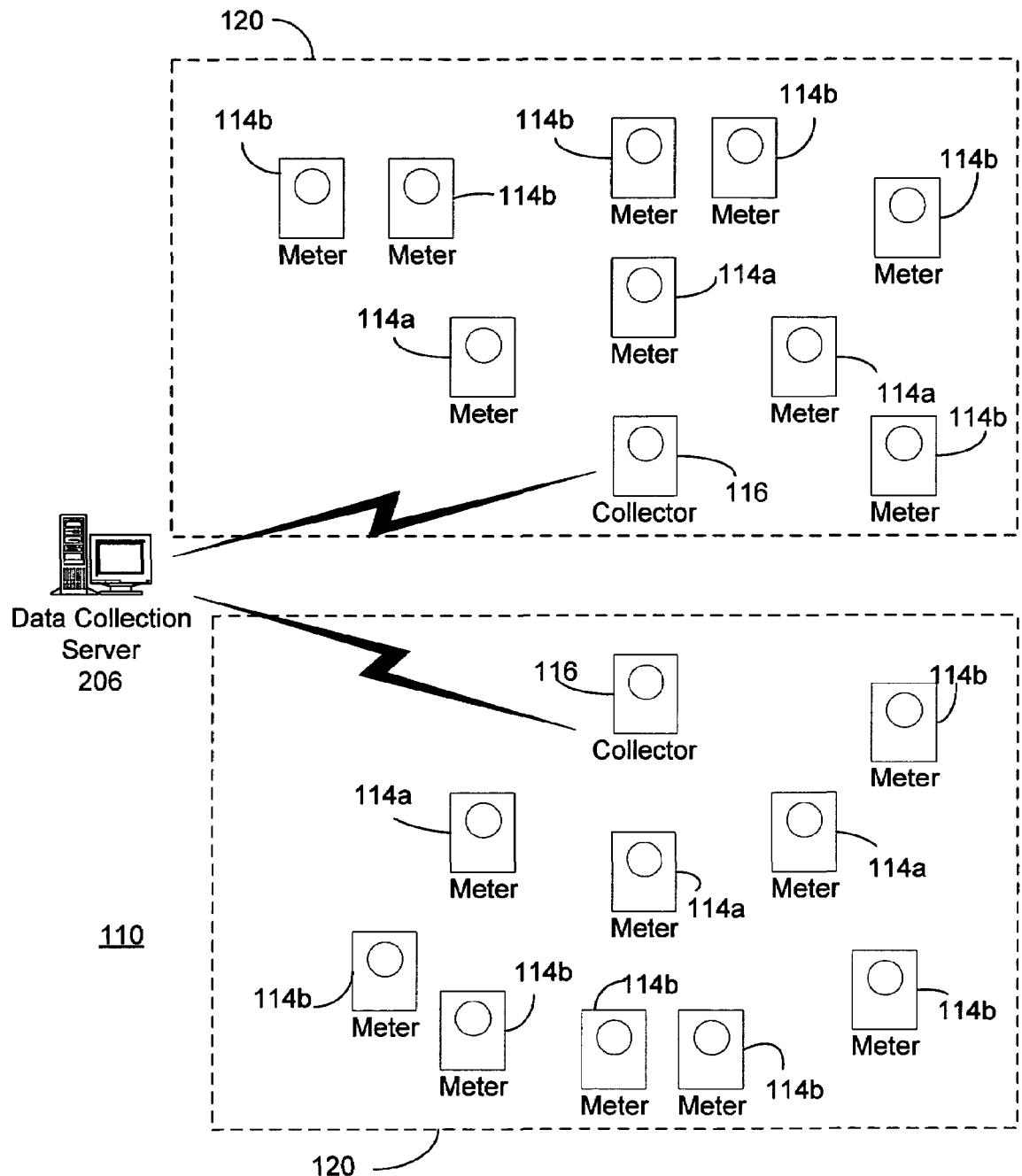
FIG. 1 is a diagram of a wireless system for collecting data from remote devices.

FIG. 1 provides a diagram of an exemplary metering system 110. System 110 comprises a plurality of meters 114, which are operable to sense and record usage of a service or commodity such as, for example, electricity, water, or gas. Meters 114 may be located at customer premises such as, for example, a home or place of business. Meters 114 comprise an antenna and are operable to transmit data, including service usage data, wirelessly. Meters 114 may be further operable to receive data wirelessly as well. In an illustrative embodiment, meters 114 may be, for example, a electrical meters manufactured by Elster Electricity, LLC.

System 110 further comprises collectors 116. Collectors 116 are also meters operable to detect and record usage of a service or commodity such as, for example, electricity, water, or gas. Collectors 116 comprise an antenna and are operable to send and receive data wirelessly. In particular, collectors 116 are operable to send data to and receive data from meters 114. In an illustrative embodiment, meters 114 may be, for example, an electrical meter manufactured by Elster Electricity, LLC.

A collector 116 and the meters 114 for which it is configured to receive meter data define a subnet/LAN 120 of system 110. As used herein, meters 114 and collectors 116 maybe considered as nodes in the subnet 120. For each subnet/LAN 120, data is collected at collector 116 and periodically transmitted to a data collection server 206. The data collection server 206 stores the data for analysis and preparation of bills. The data collection server 206 may be a specially programmed general purpose computing system and may communicate with collectors 116 wirelessly or via a wire line connection such as, for example, a dial-up telephone connection or fixed wire network.

Generally, collector 116 and meters 114 communicate with and amongst one another using any one of several robust wireless techniques such as, for example, frequency hopping spread spectrum (FHSS) and direct sequence spread spectrum (DSSS). As illustrated, meters 114a are "first level" meters that communicate with collector 116, whereas meters 114b are higher level meters that communicate with other meters in the network that forward information to the collector 116.

Figure 2:
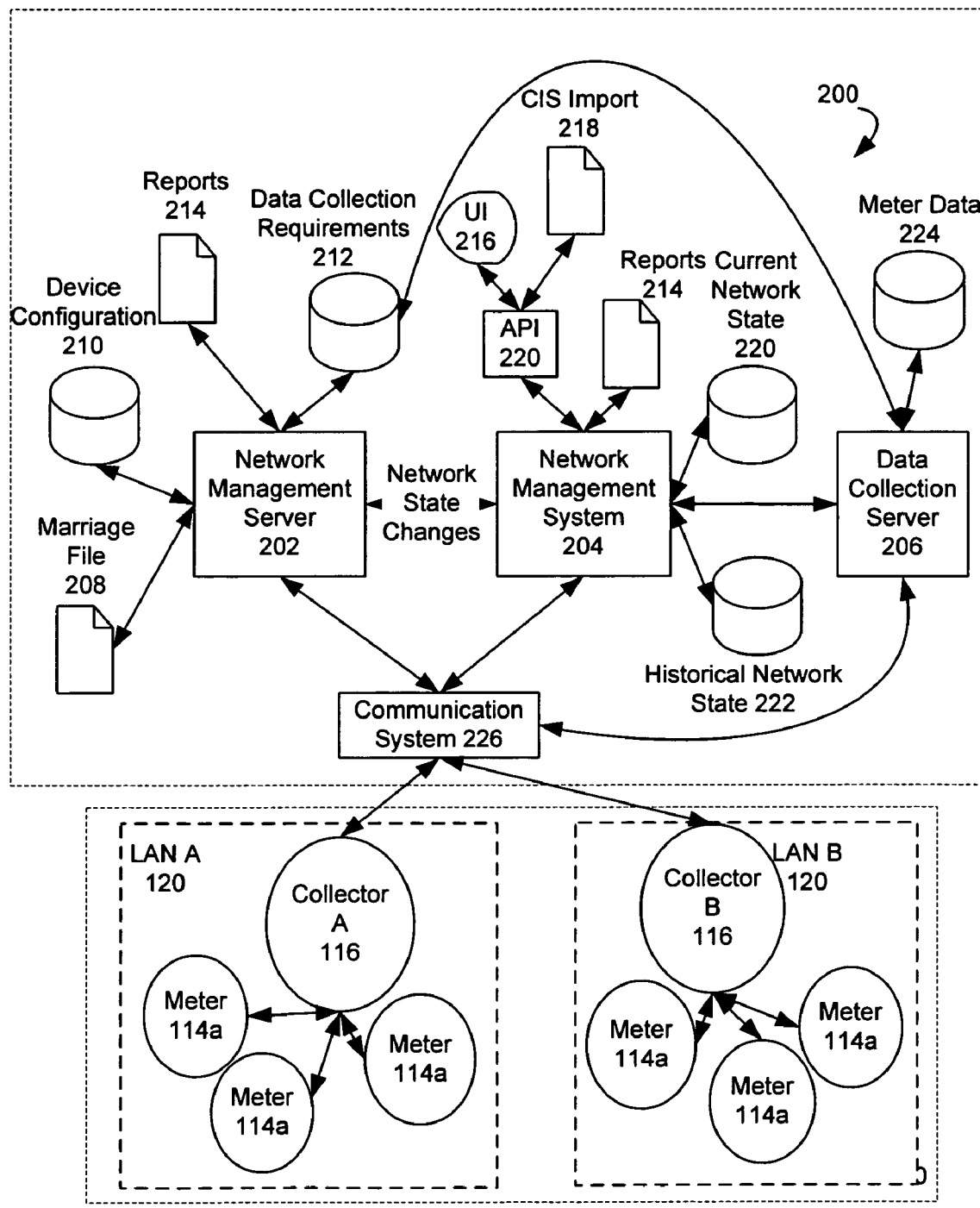
FIG. 2 expands upon the diagram of FIG. 1 and illustrates a system in which the present invention is embodied.
Figure 3:
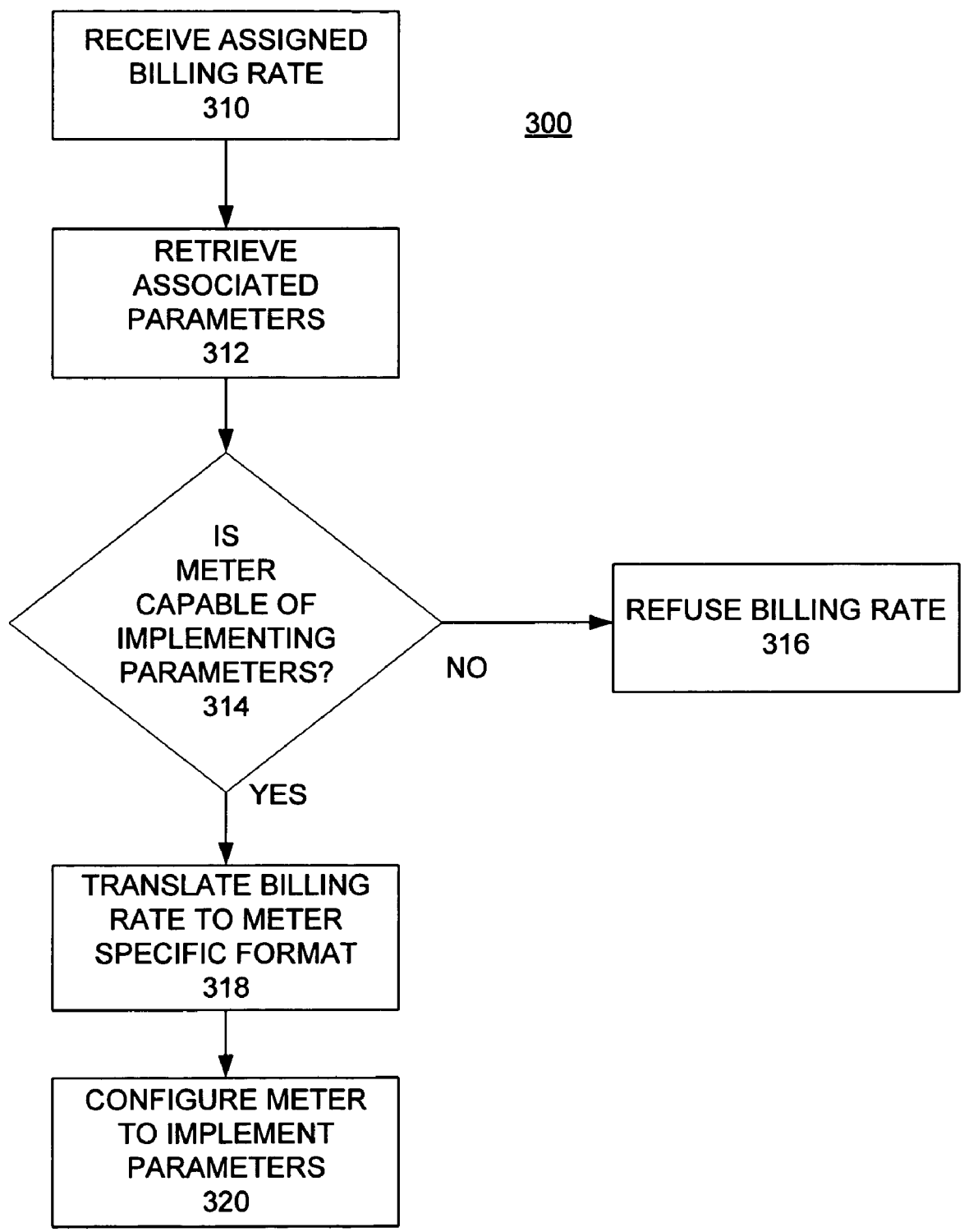
FIG. 3 illustrates an exemplary sequence of events when a billing rate is assigned to a meter.

Referring now to FIG. 2, there is illustrated a system 200 in which the present invention may be embodied. The system 200 includes a network management server 202, a network management system (NMS) 204 and a data collection server 206 that together manage one or more subnets/LANs 120 and their constituent nodes. The NMS 204 tracks changes in network state, such as new nodes registering/unregistering with the system 200, node communication paths changing, etc. This information is collected for each subnet/LAN 120 and are detected and forwarded to the network management server 202 and data collection server 206.

In accordance with an aspect of the invention, communication between nodes and the system 200 is accomplished using the LAN ID, however it is preferable for customers to query and communicate with nodes using their own identifier. To this end, a marriage file 208 may be used to correlate a customer serial number and LAN ID for each node (e.g., meters 114a) in the subnet/LAN 120. A device configuration database 210 stores configuration information regarding the nodes. For example, in the metering system 110, the device configuration database may the time of use (TOU) program assignment for the meters 114a communicating to the system 200. A data collection requirements database 212 contains information regarding the data to be collected on a per node basis. For example, a user may specify that metering data such as load profile, demand, TOU, etc. is to be collected from particular meter(s) 114a. Reports 214 containing information on the network configuration may be automatically generated or in accordance with a user request.

The network management system (NMS) 204 maintains a database describing the current state of the global fixed network system (current network state 220) and a database describing the historical state of the system (historical network state 222). The current network state 220 contains data regarding current meter to collector assignments, etc. for each subnet/LAN 120. The historical network state 222 is a database from which the state of the network at a particular point in the past can be reconstructed. The NMS 204 is responsible for, amongst other things, providing reports 214 about the state of the network. The NMS 204 may be accessed via an API 220 that is exposed to a user interface 216 and a Customer Information System (CIS) 218. Other external interfaces may be implemented in accordance with the present invention. In addition, the data collection requirements stored in the database 212 may be set via the user interface 216 or CIS 218.

The data collection server 206 collects data from the nodes (e.g., collectors 116) and stores the data in a database 224. The data includes metering information, such as energy consumption and may be used for billing purposes, etc. by a utility provider.

The network management server 202, network management system 204 and data collection server 206 communicate with the nodes in each subnet/LAN 120 via a communication system 226. The communication system 226 may be a Frequency Hopping Spread Spectrum radio network, a mesh network, a Wi-Fi (802.11) network, a Wi-Max (802.16) network, a land line (POTS) network, etc., or any combination of the above and enables the system 200 to communicate with the metering system 110.

The present invention enables multiple billing rates to be defined, named, and stored. Each such billing rate may include time of use (TOU) configuration parameters and/or demand configuration parameters. Alternatively, a billing rate may include strictly consumption based parameters. The billing rates may also include display settings for meter display areas. The billing rates may be defined and named via UI 216 and may be stored within device configuration database 210.

Each billing rate is "meter independent", meaning that it is not specific to any particular meter configuration format. The billing rate is defined in a format that is convenient for the operator and then translated into a format that is specific to each meter on which it is implemented. Each billing rate may, at any time, be displayed in a meter independent format so that it can be easily evaluated by an operator. The billing rates may be displayed via UI 216.

A particular billing rate may be assigned to one or more selected meters either manually or programmatically. The billing rate may be assigned programmatically using, for example, a CIS software package. The billing rate may be assigned manually by, for example, selecting the billing rate by name from a set of available billing rates stored at configuration database 210. FIG. 3 illustrates an exemplary sequence of events when a billing rate is assigned to selected meters. At step 310, the assigned billing rate is received by NMS 204. If assigned manually, the billing rate may be received via UI 216, or, if assigned programmatically, the billing rate may be received via CIS import 218. As should be appreciated, each selected meter may be assigned the billing rate as its initial billing rate or, at any time, one or more meters may have their assignment changed from one billing rate to another.

At step 312, the configuration parameters associated with the billing rate are retrieved. The configuration parameters may be retrieved from configuration database 210. The configuration parameters are originally assigned when the billing rate is defined, but may be subsequently updated. As discussed previously, the configuration parameters may include TOU and/or demand parameters or, alternatively, consumption based parameters. The configuration parameters may also include meter display settings.

At step 314, it is determined whether the selected meters are capable of implementing the retrieved configuration parameters. Specifically, the meters may have limited capabilities with respect to TOU and demand parameters. For example, the configuration parameters of the billing rate may require more tiers or more seasons than a particular meter is capable of implementing. System 200 may also be otherwise incapable of configuring a meter due to another problem such as, for example, a network communications problem. If any of the selected meters are unable to implement the parameters or if they cannot otherwise be configured, then, at step 316, the assigned billing rate may be refused for those meters.

For those meters that are configurable, at step 318, the billing rate parameters are translated from the meter independent format into a format that is specific to each meter. At step 320, the meters are configured to implement the billing rate parameters. Each meter may be configured according to its particular limitations and requirements. For example, configuration calls used to deliver TOU parameters, demand parameters, and/or display settings may be made using a device specific communications protocol. In the case of telephone connected devices, the allowable time windows for device configuration calls can be manually set. For each meter, the configuration operation may be repeatedly retried until it is successful. At any stage of the configuration process, reports may be requested and generated to indicate the progress of the process. Specifically, such reports may indicate which meters are to be configured, the progress of TOU and/or demand configurations, and which meters could not be configured.

Each of the selected meters may be programmed to display items related to its assigned billing rate, even if the underlying configuration of the meter is not exactly identical to the rate. For example, if the rate defines three tiers, but the meter, because of its programming limitations, must be programmed to implement four tiers, then the meter will be configured to only display the three tiers of the billing rate. In one embodiment, a meter may be configured to display time and date only if the meter is assigned to a TOU rate. In another embodiment, demand items may be displayed only if there is a demand component in the rate, even if a meter's underlying configuration always computes demands.

During the TOU configuration process, a meter's summation registers may optionally be cleared if the meter supports and the operator has enabled this functionality. Additionally, during the demand and TOU configuration process, a meter's demand registers can optionally be reset if the meter supports and the operator has enabled this functionality. Furthermore, each configured meter may be logged for auditing purposes.

While systems and methods have been described and illustrated with reference to specific embodiments, those skilled in the art will recognize that modification and variations may be made without departing from the principles described above and set forth in the following claims. Accordingly, reference should be made to the following claims as describing the scope of disclosed embodiments.

What is claimed:

1. A method for automated configuration of a meter according to a billing rate, the method comprising:

receiving an identification of the billing rate according to which the meter is to be configured, the identification of the billing rate including a name of the billing rate and not including configuration parameters associated with the billing rate;

responsive to receiving the identification of the billing rate, retrieving, from stored data, the configuration parameters associated with the billing rate, the configuration parameters comprising at least a number of seasons included in the billing rate and a number of billing tiers included in the billing rate;

responsive to receiving the identification of the billing rate, retrieving, from stored data, meter configuration capability information indicating a configuration capability of the meter including at least a maximum number of seasons for which the meter is configurable and a maximum number of billing tiers for which the meter is configurable;

receiving configuration parameters associated with the billing rate;

prior to configuring or refusing to configure the meter, determining based on the meter configuration capability information and the configuration parameters whether the meter is capable of implementing the configuration parameters associated with the billing rate, wherein the determining comprises determining whether the number of seasons and the number of tiers included in the billing rate is less than or equivalent to the maximum number of seasons and the maximum number of tiers included in the meter configuration capability information;

if not, then: refusing to configure the meter to implement the configuration parameters associated with the billing rate; and is so, then:

translating the billing rate from a meter independent format into a format specific to the meter; and configuring, by a server, the meter in accordance with the meter's particular requirements to implement the configuration parameters associated with the billing rate.

2. The method of claim 1, wherein the configuration parameters comprise time of use parameters and demand parameters.

3. The method of claim 1, further comprising:

receiving configuration parameters associated with the billing rate comprising meter display settings; and programming a display area of the meter according to the meter display settings to display information relevant to the billing rate.

4. The method of claim 3, comprising programming the display area of the meter according to the meter display settings when an underlying configuration of the meter is different from configuration parameters of the billing rate.

5. The method of claim 1, wherein configuring the meter in accordance with the meter's particular requirements comprises communicating with the meter in a communication protocol specific to the meter.

6. The method of claim 1, further comprising storing the billing rate at a device configuration database that stores a plurality of available billing rates.

7. The method of claim 1, further comprising clearing the meter's summation register during configuration of the meter.

8. The method of claim 1, further comprising resetting the meter's demand register during configuration of the meter.

9. The method of claim 1, further comprising logging the meter for auditing purposes during configuration of the meter.

10. The method of claim 1, further comprising:
    receiving updated configuration parameters associated with the billing rate; and
    configuring the meter to implement the updated configuration parameters.

11. The method of claim 1, further comprising generating a report detailing progress of billing rate configuration, the report comprising at least one of a list of meters assigned to the billing rate, a list of meters which have already been configured to implement the configuration parameters associated with the billing rate, and a list of meters that cannot be configured to implement the configuration parameters associated with the billing rate.

12. The method of claim 1, further comprising displaying the configuration parameters associated with the billing rate in a meter independent format.

13. A system for automated configuration according to a billing rate, the system comprising:
    a meter that is configured in a format specific to the meter;
    a server that:
        receives an identification of the billing rate according to which the meter is to be configured, the identification of the billing rate including a name of the billing rate and not including configuration parameters associated with the billing rate;
        responsive to receiving the identification of the billing rate, retrieves, from stored data, the configuration parameters associated with the billing rate, the configuration parameters comprising at least a number of seasons included in the billing rate and a number of billing tiers included in the billing rate;
        responsive to receiving the identification of the billing rate, retrieves, from stored data, meter configuration capability information indicating a configuration capability of the meter including at least a maximum number of seasons for which the meter is configurable and a maximum number of billing tiers for which the meter is configurable; and
        prior to configuring or refusing to configure the meter, determines based on the meter configuration capability information and the configuration parameters whether the meter is capable of implementing the configuration parameters associated with the billing rate, wherein the determining comprises determining whether the number of seasons and the number of tiers included in the billing rate is less than or equivalent to the maximum number of seasons and the maximum number of tiers included in the meter configuration capability information;
    wherein, if the meter is not capable of implementing the configuration parameters associated with the billing rate, then the server refuses to configure the meter to implement the configuration parameters associated with the billing rate; and
    wherein, if the meter is capable of implementing the configuration parameters associated with the billing rate, then the server provides instructions to translate the billing rate from a meter independent format into the format specific to the meter and to configure the meter in accordance with the meter's particular requirements to implement the configuration parameters associated with the billing rate.

14. The system of claim 13, further comprising a user interface that enables a user to define the billing rate in the meter independent format.

15. The system of claim 13, further comprising a user interface that enables a user to assign the billing rate to the meter.

16. The system of claim 13, further comprising an application program interface that receives a command from a software package to assign the billing rate to the meter.

17. The system of claim 13, further comprising a device configuration database that stores a plurality of available billing rates from which the billing rate may be selected and assigned to the meter.

18. The system of claim 13, wherein the configuration parameters associated with the billing rate comprise time of use parameters and demand parameters.

19. The system of claim 13, wherein the configuration parameters associated with the billing rate comprise meter display parameters for displaying information relevant to the billing rate on a display area of the meter.

\* \* \* \* \*